(12) United States Patent
Simons et al.

(10) Patent No.: US 12,613,267 B2
(45) Date of Patent: Apr. 28, 2026

(54) SYSTEMS AND METHODS FOR FAULT LOCATING IN WYE-GROUNDED UTILITY SYSTEMS AND OTHER UTILITY SYSTEMS

(71) Applicant: PPL Services Corporation, Allentown, PA (US)

(72) Inventors: Nate Simons, Allentown, PA (US); Robert Beckett, Allentown, PA (US); Donald Vinciguerra, Allentown, PA (US); Carol Gillette, Allentown, PA (US)

(73) Assignee: PPL Services Corporation, Allentown, PA (US)

( * ) Notice: Subject to any disclaimer, the term of this patent is extended or adjusted under 35 U.S.C. 154(b) by 127 days.

(21) Appl. No.: 18/545,634

(22) Filed: Dec. 19, 2023

(65) Prior Publication Data

US 2025/0199048 A1 Jun. 19, 2025

(51) Int. Cl.
G01R 31/08 (2020.01)
G01R 31/52 (2020.01)

(52) U.S. Cl.
CPC .......... G01R 31/086 (2013.01); G01R 31/52 (2020.01)

(58) Field of Classification Search
None
See application file for complete search history.

(56) References Cited

U.S. PATENT DOCUMENTS

| | | | |
|---|---|---|---|
| 2013/0070378 A1* | 3/2013 | Witte | H01H 83/12 |
| | | | 307/125 |
| 2017/0115335 A1* | 4/2017 | Pamulaparthy | G01R 31/52 |

* cited by examiner

*Primary Examiner* — Farhana A Hoque
(74) *Attorney, Agent, or Firm* — Haynes and Boone, LLP; Robert P. Ziemian

(57) ABSTRACT

A method for locating a fault in an electric utility system includes retrieving fault data, with a computing system and analyzing relay history to find a pattern of events and locations, with the computing system. The method further includes analyzing the fault data to determine an approximate location with the computing system and determining, with a short circuit and load flow module, a pre-fault load. The method further includes running a short circuit study at a plurality of locations until a location is found that corresponds to the fault data and determining that the location is where a fault occurred.

16 Claims, 2 Drawing Sheets

SYSTEMS AND METHODS FOR FAULT LOCATING IN WYE-GROUNDED UTILITY SYSTEMS AND OTHER UTILITY SYSTEMS

BACKGROUND

Many aspects of this disclosure relate to a manual engineering process using protective relay event records, system simulations in short circuit and load flow software, and other event data, if available.

Solidly-wye-grounded utility systems are subject to different fault types, such as three-phase (3P), phase-to-phase (PP), and phase-to-ground (PG), among others, but most faults fall into these three categories. This process can be used for all fault types, but this disclosure is focused on the three listed (3P, PP, PG) since they are by far the most common.

Utilities experience these faults for various reasons. Primarily they are:

3P: Tree contacts or Vehicular Pole Contacts

PP: Conductor Slap/Galloping Conductors

PG: Tree contacts or Vehicular Pole Contacts

It is important to distinguish the cause of faults because it can assist in locating when there is an incipient failure. For example, a vehicle contacting a pole event is located relatively quickly and automatically using a centralized distribution management systems (DMS), and usually calls from first responders. Conversely, three-phase equipment that is failing, such as a transformer or switch, could have no visual indication and thus cannot be easily or quickly located automatically or by visual inspection. This process works for both scenarios, making it flexible and effective, but is most critical when the cause of the event is not easily determined, and engineers must manually analyze the data to determine the cause.

The most common example of this manual process is a tree encroachment. Often the tree contacts the utility line and there is no visual indication because the tree branch burns clear. Over time, usually 1-3 years, the encroachment gets worse and the contacts more common, until eventually the tree does not burn clear, and a permanent outage is experienced. Therefore, embodiments are provided below that include processes to locate the fault will reduce the number of momentary interruptions customers experience, but also prevent a future permanent outage by eliminating the cause (in this case, trimming back the trees).

BRIEF SUMMARY

In many embodiments, a system is provided that uses protective relay and other system event data, combined with system simulation software, to accurately locate faults on solidly-wye-grounded utility systems. Embodiments of these processes have been curated over years of effort and hundreds of analyzed events and has proven to be highly accurate. Fast and effective fault locating improves customer service by quickly directing crews to the problem so it can be fixed, and customers restored, but also eliminates future interruptions of service by finding transient faults, such as tree encroachments, that will eventually cause a permanent outage, and correcting the issue before it becomes a problem.

In one embodiment, a method for locating a fault in an electric utility system includes retrieving fault data, with a computing system and analyzing relay history to find a pattern of events and locations, with the computing system. The method further includes analyzing the fault data to determine an approximate location with the computing system and determining, with a short circuit and load flow module, a pre-fault load. The method further includes running a short circuit study at a plurality of locations until a location is found that corresponds to the fault data and determining that the location is where a fault occurred. Alternatively, the fault data includes relay event records, oscillography history, and sequence of events records. In one alternative, the analyzing the fault data includes using phases and magnitude and angle of current. In another alternative, the analyzing the fault data includes analyzing digital bits. Alternatively, the running the short circuit study includes determining the location where magnitude, angle, and phase(s) from the protective relay event data correspond to modeled short circuit data. In another alternative, the plurality of locations correspond to a plurality of sensors deployed in the electric utility system. Alternatively, the determining the pre-fault load includes reviewing the oscillography history and the sequence of events records to determine if there is any variation in current magnitude. In another alternative, the determining the pre-fault load includes determining what digital bits asserted during the fault.

In one embodiment, system for locating a fault in an electric utility system includes a computing system, wherein the computing system is configured to and executes commands causing the computing system to retrieve fault data and analyze relay history to find a pattern of events and locations. The system is further configured to analyze the fault data to determine an approximate location and determine, with a short circuit and load flow module, a pre-fault load. The system is further configured to run a short circuit study at a plurality of locations until a location is found that corresponds to the fault data and determine that the location is where a fault occurred. In one alternative, the fault data includes relay event records, oscillography, history, and sequence of events records. In another alternative, the analyze the fault data step includes using phases and magnitude and angle of current. Alternatively, the analyze the fault data step includes analyzing digital bits. In another alternative, the run the short circuit study step includes determining the location where magnitude, angle, and phase(s) from the protective relay event data correspond to modeled short circuit data. Alternatively, the plurality of locations correspond to a plurality of sensors deployed in the electric utility system. In another alternative, the determine the pre-fault load step includes reviewing the oscillography history and the sequence of events records to determine if there is any variation in current magnitude. Alternatively, the determine the pre-fault load step includes determining what digital bits asserted during the fault.

BRIEF DESCRIPTION OF THE FIGURES

The accompanying drawings, which are included to provide a further understanding of the disclosure, are incorporated in, and constitute a part of this specification, illustrate embodiments of the disclosure and together with the detailed description explain the principles of the disclosure. No attempt is made to show structural details of the disclosure in more detail than may be necessary for a fundamental understanding of the disclosure.

DETAILED DESCRIPTION

Figure 1:
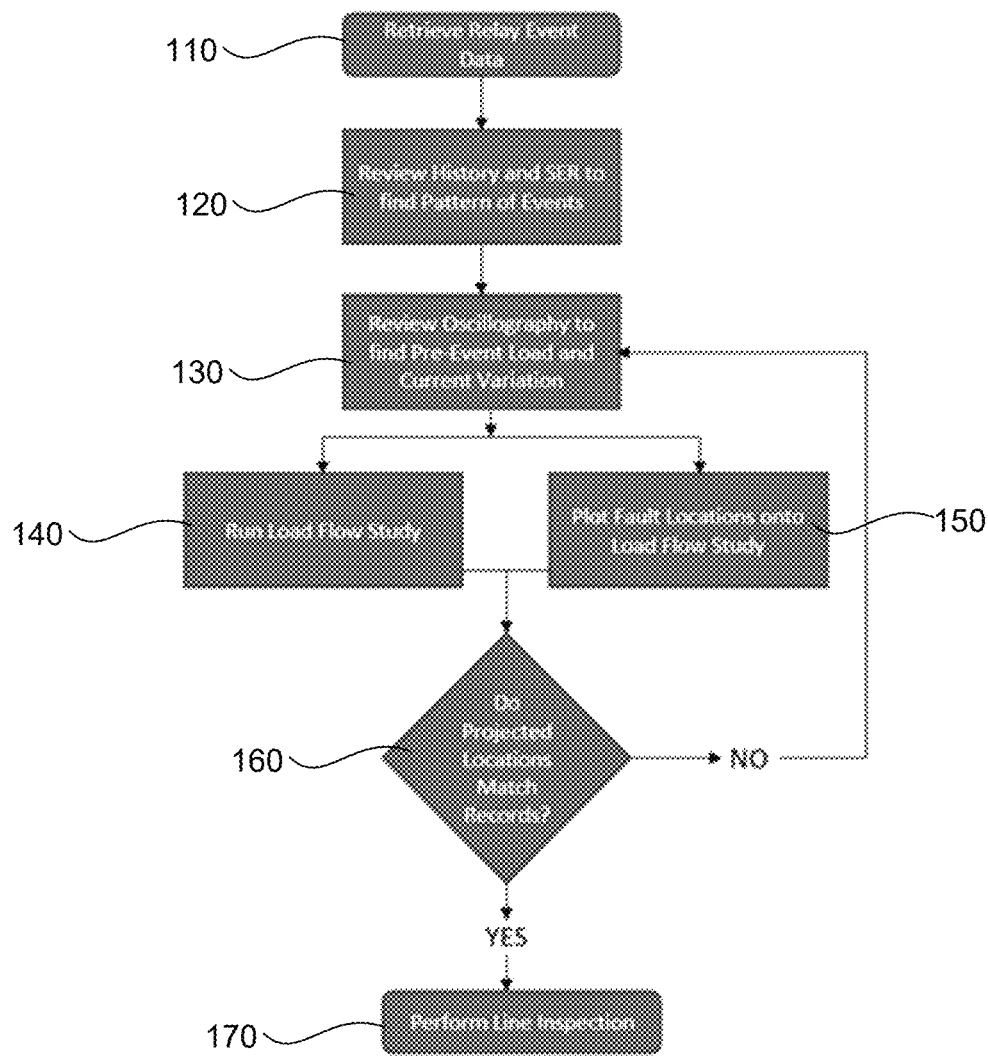
FIG. 1 shows one embodiment of an Advanced Fault Locator.

Certain terminology is used herein for convenience only and is not to be taken as a limitation on the embodiments of the systems and methods for Fault Locating in WYE-Grounded Utility Systems and other utility systems. (embodiments of which may be hereinafter referred to as "Advanced Fault Locator"). In some embodiments, an Advanced Fault Locator may be implemented in a computing system. Generally, embodiments of the Advanced Fault Locator enhance the operation of a power grid system by quickly identifying the locations of faults so that power may be rerouted and resources to fix issues may be deployed. Embodiments of an Advanced Fault Locator improve the processing of computing systems in that they allow faster analysis of fault data. In many embodiments of an Advanced Fault Locator, various records concerning the performance of the system are retrieved. The records may include relay event records, oscillography, history, and sequence of events data. These records may be stored at a central repository for data or may be distributed among many repositories or resident at particular sensing apparatuses. Subsequently, the relay history is analyzed to find a pattern of events and locations. Then oscillography, digital bits, and SER may be analyzed to determine an approximate location via the phase(s) involved and the magnitude and angle of the current. The point of this process is to narrow down an area for analysis. Analyze the oscillography, digital bits, and SER (Sequence of Events Records) information to determine an approximate location via the phase(s) involved and the magnitude and angle of the current. Then using short circuit and load flow modules, the systems and methods run a load flow to establish the pre-fault load, then run a short circuit study at various locations until a location can be found that directly corresponds to the magnitude, angle, and phase(s) from the protective relay event data retrieved.

These processes may be implemented as a program or program that is partially human assisted in some aspects. In many configurations, the Advanced Fault Locator may improve the way a computing system operates by utilizing short circuit and load flow software that is guided by analysis or patterns and approximate locations via the phase(s) involved and the magnitude and angle of the current. Such analysis, allows the system to detect faults more accurately and consistently. Furthermore, the embodiments of Advanced Fault Locators are operating on a specific power grid and detecting real world fault occurrences.

In many embodiments, a process for fault locating consists of the following steps:

1) Retrieve relay event records, oscillography, history, and sequence of events
2) Analyze the relay history to find a pattern of events and locations
3) Analyze the oscillography, digital bits, and SER (Sequence of Events Records) information to determine an approximate location via the phase(s) involved and the magnitude and angle of the current
4) Using short circuit and load flow software, run a load flow to establish the pre-fault load, then run a short circuit study at various locations until a location can be found that directly corresponds to the magnitude, angle, and phase(s) from the protective relay event data retrieved in step (1)

A computing system or human assisted computing system will follow these steps to predict one or multiple trouble locations and communicate that data to system operators and crews to perform a line patrol and equipment inspection and/or test.

FIG. 1 shows one embodiment of an Advanced Fault Locator. In step 110, the relay event data is retrieved. In step 120, the history and SER is reviewed to find a pattern of events. In step 130, the oscillography is reviewed to find pre-event load and current variation. In step 140, a load flow study is conducted. In step 150, fault locations are plotted onto the load flow study. In decision step 160, it is determined whether the projected fault locations match. If yes, then in step 170 the fault location is indicated as determined and a line inspection is conducted. If not, then step 150 through step 170 repeat.

A goal of embodiments of the process is to find faults, either permanent or transient, so corrective actions can be taken, and customers restored, and future outages prevented. To that end, embodiments of the process start with a precipitating event that causes a protective relay to either detect a fault, or trip to isolate a fault. This is a key distinction because incipient faults often cause a short-circuit that doesn't last long enough to time-out the protective relay, so protective trips alone cannot be relied upon. In some cases, an event will have overcurrent assertions and trips, or only one of those types.

For the purposes of this disclosure, "overcurrent" is an ANSI relay element 50 or 51 that determines when a phase or ground analog quantity exceeds the defined threshold. A "protective relay" is a type of relay specifically designed to detect power system faults and is commonly used by utilities to protect equipment. "TRIP" is a specific protective relay function that commands a circuit breaker or recloser to open, after a specified time delay.

Below is an exemplary procedure conducted to find faults.

Step 1

The first step is to analyze the relay history and look for overcurrent events that indicate a clear fault or pattern of faults. An example is shown in Table 1.

TABLE 1

| Example Relay History | | | | |
|---|---|---|---|---|
| Date | Time | Phase | Magnitude | Element |
| Mar. 4, 2030 | 00:52:27 | AB | 3,355 A | 51P |
| Feb. 15, 2030 | 07:16:19 | A | 2,920 A | 51A |
| Jan. 3, 2030 | 11:12:12 | ABC | 800 A | 51P |
| Jan. 3, 2030 | 11:12:00 | AB | 3,400 A | 51PT, TRIP |
| Jan. 1, 2030 | 00:15:23 | A | 3,000 A | 51A |

Table 1 shows a clear pattern of contact on Phase A and Phase B via the assertion of the relay overcurrent elements (51). The ABC event that occurred after the TRIP event is overcurrent triggered by transformer magnetizing in-rush current and therefore excluded from the pattern. Using this data gives a trouble location that corresponds to a PG fault on Phase A of magnitude 2,900 to 3,000 A and a PP fault at the same location on Phases AB with a magnitude of 3,300 to 3,400 A. It is possible these are two separate events, or the same event, so both types of faults must be plotted, and the locations correlated as the same or different locations. An example is two separate locations of tree contact, or a single tree that is first encroaching on Phase A, which is closest, then Phase B, the next closest phase.

While this data is typically enough to plot an accurate location, that is not always the case. Step is a way of refining the location based on more detailed event data.

Step 2

Step 2 is to review the relay oscillography and digital event records to see if there is any variation in current magnitude not recorded in the history, to find the pre-fault load, and to see what digital bits asserted during the event, which can give a clue to why the fault event is occurring.

Pre-Fault Load: This information is used to refine the fault location by adding the load current on top of the fault current. The relay that records the events(s) will not see only fault current, but fault+load, so this makes locating more accurate.

Current Variation: The relay history typically reports the highest peak magnitude of the waveform, which usually corresponds to the fault location, but can vary based on what other equipment is on the line. It is important to view the oscillography to find the highest peak magnitude, but also to see how the waveform changes (if it changes). As an example, Phase A might show the highest peak and trigger the history to report Phase A, but if Phase B and Phase C are also displaying high current the event is not PG on Phase A, but 3PH event on Phase ABC, which will drastically alter the location, but also possible the piece of equipment that is having trouble.

Digital Bits: In most cases this is a straightforward application to confirm what protective elements triggered the event recording. Occasionally, a device may fail or have bad programming, but can still look like a correct operation at first glance. Reviewing the digital bits confirms the event is a real one and not a failure of the device that is masked by some other trouble event.

With steps 1-2 completed the location can accurately be determined in many cases, however there may yet be even more variation that can be determined by reviewing the relay Sequence of Events, as shown in step 3.

Step 3

Step 3 is to review the relay Sequence of Events Records, or SER. The SER is a collection of digital bits with time stamps that gives a much longer view of device operation than the event records, which are only a few seconds. The SER can show when the relay tripped, why it tripped, and if other devices on the line tripped. This is yet more important information in determining the order of operations of complex events.

For example, a PG fault may cause a PP fault upstream from the relay being analyzed. This is commonly referred to as "conductor slap," and is caused by improperly sagged wires galloping during the initial fault. The trip of the upstream device for the PP fault can be seen by the loss of power in the relay in question, which often explains why a single tree contact causes two devices to trip out. A sample SER may look as follows:

51P ASSERTED (Phase time-overcurrent asserted)

51PT ASSERTED (Phase time-overcurrent initiated a trip)

52A DEASSERTED (Circuit breaker opened)

LOP ASSERTED (Loss of potential asserted-upstream device opened)

LOP DEASSERTED (Loss of potential de-asserted-upstream device closed)

52A ASSERTED (Circuit breaker closed)

The sequence of events shown is for an overcurrent fault the relay detects (51P ASSERTED), then trips for (51PT ASSERTED), then opens to clear (52A DEASSERTED).

But after opening the upstream relay trips as shown via loss of potential (LOP ASSERTED), then closes back in (LOP DEASSERTED), at which point the downstream relay closes (52A ASSERTED). This sequence shows there are two faults on the line, with the second one caused by the first, and this information can then be used to locate both problems.

Step 4

The last step is to compile the analysis from steps 1-3, make an educated guess as to the location, then, using system simulation software, run a load flow+short circuit study at the projected locations. When performing this step, the load must be properly allocated to match the pre-fault load, and the current at the relay in question monitored, not at the fault location. System simulations of this nature often involve thousands of nodes for a single event. If not properly filtered this can provide misleading and/or repetitive information about the fault location, so proper filtering of information via system simulation is necessary for precision.

The current magnitude and angle, as shown from the relay records, is studied at the relay in question. System simulation software provides highly accurate projections of fault location when the model is well-maintained, and this method is used correctly. It is also important to correctly plot the locations on the phase(s) the relay recorded so that crews do not waste time patrolling Phase B, when, for example, the fault was on Phase A, as shown by the relay records.

If the initial projected locations match a line patrol is initiated. If the locations do not match steps 1-4 are repeated until an approximate location is determined, at which point a line patrol is initiated. This process is repeated until all system simulations match the records retrieved from all relays and the description of the event provided by system operators.

The process has been used to locate tree encroachments, failing underground or aerial cable, vine growth, failing transformers, switches, and capacitor banks, and in rare cases failing overhead conductors, including conductor slap. As mentioned, this process has been refined through hundreds of events analyzed by the inventors and has proven highly accurate, greater than 90%, leading to large improvements in corrective actions that improve service to utility customers.

Figure 2:
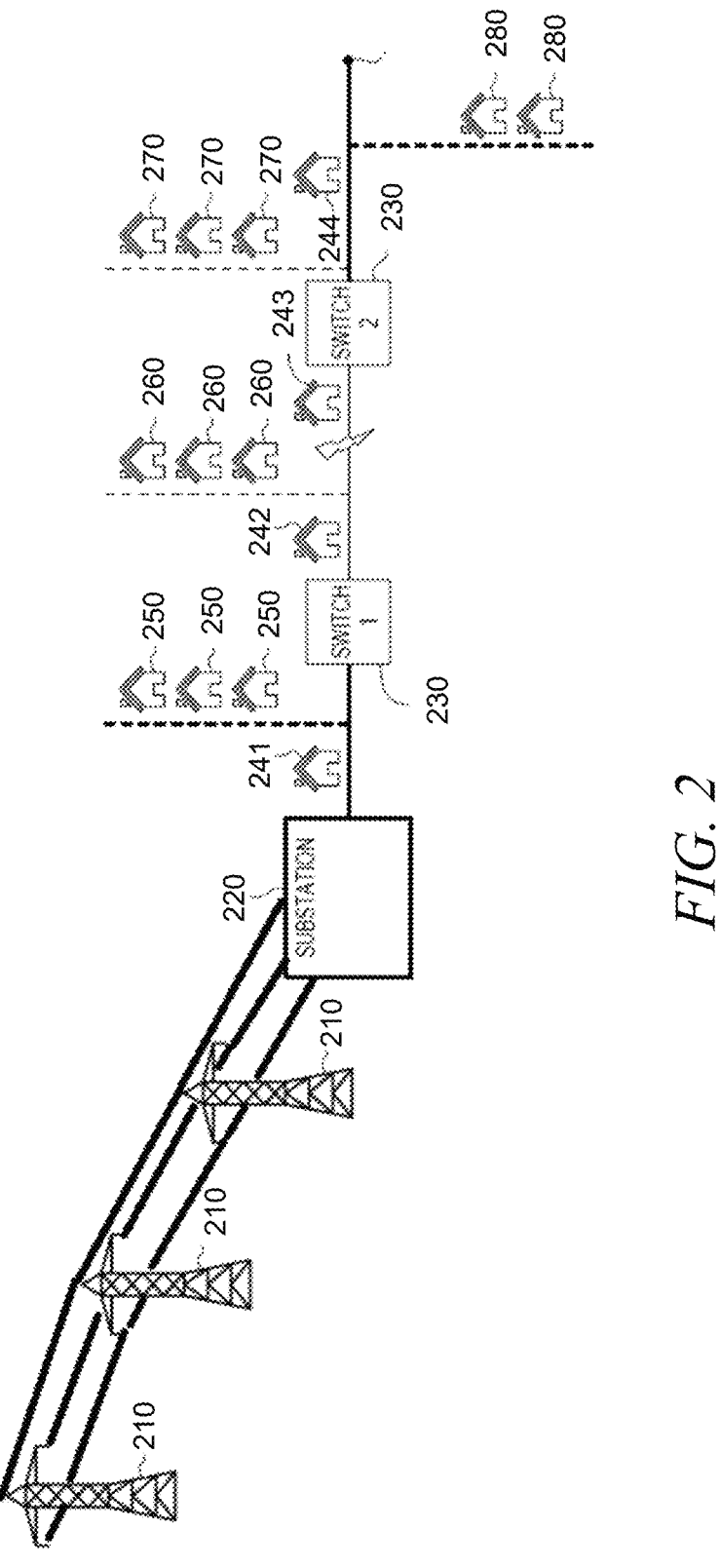
FIG. 2 shows one embodiment of a simplified power system on which embodiments of the Advanced Fault Locator may operate.

FIG. 2 depicts one embodiment of a simplified power distribution system. In such a system faults may occur in many different locations in the power distribution network. For instanced, tri-phase transmission operates between the large transmission towers 210. These transmission towers 210 may transmit phased power separated by 120 degrees and may lend to fault detection when one phase is detected as having a fault. Further, the grid may include multiple substations 220 that covert the tri-phase transmission. Homes/other buildings 241, 243, 244 may exist on a main transmission line and these homes/other buildings 241, 243, 244 are representative of many more homes/other buildings. Additionally, the grid may include multiple subsegments 250, 260, 270, 280, potentially representative of hundreds or thousands of homes/other buildings. Switches 230 may be located in the grid as well. Prefault loads and additionally electrical characteristics may be collected in such a power distribution system.

In many embodiments, parts of the system are provided in devices including microprocessors. Various embodiments of the systems and methods described herein may be implemented fully or partially in software and/or firmware. This software and/or firmware may take the form of instructions contained in or on a non-transitory computer-readable storage medium. Those instructions then may be read and executed by one or more processors to enable performance of the operations described herein. The instructions may be in any suitable form such as, but not limited to, source code, compiled code, interpreted code, executable code, static code, dynamic code, and the like. Such a computer-readable medium may include any tangible non-transitory medium for storing information in a form readable by one or more computers such as, but not limited to, read only memory (ROM); random access memory (RAM); magnetic disk storage media; optical storage media; a flash memory, etc.

Embodiments of the systems and methods described herein may be implemented in a variety of systems including, but not limited to, smartphones, tablets, laptops, and combinations of computing devices and cloud computing resources. For instance, portions of the operations may occur in one device, and other operations may occur at a remote location, such as a remote server or servers. For instance, the collection of the data may occur at a smartphone, and the data analysis may occur at a server or in a cloud computing resource. Any single computing device or combination of computing devices may execute the methods described.

In various instances, parts of the method may be implemented in modules, subroutines, or other computing structures. In many embodiments, the method and software embodying the method may be recorded on a fixed tangible medium.

While specific embodiments have been described in detail in the foregoing detailed description and illustrated in the accompanying drawings, it will be appreciated by those skilled in the art that various modifications and alternatives to those details could be developed in light of the overall teachings of the disclosure and the broad inventive concepts thereof. It is understood, therefore, that the scope of this disclosure is not limited to the particular examples and implementations disclosed herein but is intended to cover modifications within the spirit and scope thereof as defined by the appended claims and any and all equivalents thereof. In many embodiments, parts of the system are provided in devices including microprocessors. Various embodiments of the systems and methods described herein may be implemented fully or partially in software and/or firmware. This software and/or firmware may take the form of instructions contained in or on a non-transitory computer-readable storage medium. Those instructions then may be read and executed by one or more processors to enable performance of the operations described herein. The instructions may be in any suitable form such as, but not limited to, source code, compiled code, interpreted code, executable code, static code, dynamic code, and the like. Such a computer-readable medium may include any tangible non-transitory medium for storing information in a form readable by one or more computers such as, but not limited to, read only memory (ROM); random access memory (RAM); magnetic disk storage media; optical storage media; a flash memory, etc.

We claim:

1. A method locating a fault in an electric utility system, the method comprising:

retrieving fault data for the electric utility system, with a computing system;

analyzing relay history to find a pattern of events and locations for the electric utility system, with the computing system;

analyzing the fault data to determine an approximate location within the electric utility system with the computing system;

determining, with a short circuit and load flow module, a pre-fault load for the electric utility system, with the computing system;

running a short circuit study at a plurality of locations until a location is found that corresponds to the fault data for the electric utility system, with the computing system;

determining that the location is where a fault occurred within the electric utility system, with the computing system.

2. The method of claim 1, wherein the fault data includes relay event records, oscillography history, and sequence of events records.

3. The method of claim 2, wherein the analyzing the fault data includes using phases and magnitude and angle of current.

4. The method of claim 3, wherein the analyzing the fault data includes analyzing digital bits.

5. The method of claim 4, wherein the running the short circuit study includes determining the location where magnitude, angle, and phase(s) from the protective relay event data correspond to modeled short circuit data.

6. The method of claim 5, wherein the plurality of locations correspond to a plurality of sensors deployed in the electric utility system.

7. The method of claim 6, wherein the determining the pre-fault load includes reviewing the oscillography history and the sequence of events records to determine if there is any variation in current magnitude.

8. The method of claim 7, wherein the determining the pre-fault load includes determining what digital bits asserted during the fault.

9. A system for locating a fault in an electric utility system, the system comprising:

a computing system, wherein the computing system is configured to and executes commands causing the computing system to:

retrieve fault data for the electric utility system, with the computing system;

analyze relay history to find a pattern of events and locations for the electric utility system, with the computing system;

analyze the fault data to determine an approximate location for the electric utility system, with the computing system;

determine, with a short circuit and load flow module, a pre-fault load for the electric utility system, with the computing system;

run a short circuit study at a plurality of locations until a location is found that corresponds to the fault data for the electric utility system, with the computing system;

determine that the location is where a fault occurred for the electric utility system, with the computing system.

10. The system of claim 9, wherein the fault data includes relay event records, oscillography history, and sequence of events records.

11. The system of claim 10, wherein the analyze the fault data step includes using phases and magnitude and angle of current.

12. The system of claim 11, wherein the analyze the fault data step includes analyzing digital bits.

13. The system of claim 12, wherein the run the short circuit study step includes determining the location where magnitude, angle, and phase(s) from the protective relay event data correspond to modeled short circuit data.

14. The system of claim 13, wherein the plurality of locations correspond to a plurality of sensors deployed in the electric utility system.

15. The system of claim 14, wherein the determine the pre-fault load step includes reviewing the oscillography history and the sequence of events records to determine if there is any variation in current magnitude.

16. The system of claim 15, wherein the determine the pre-fault load step includes determining what digital bits asserted during the fault.

* * * * *